United States Patent [19]

Maruyama

[11] Patent Number: 4,920,312

[45] Date of Patent: Apr. 24, 1990

[54] MULTIPLIER

[75] Inventor: Ryoji Maruyama, Yokohama, Japan

[73] Assignee: Kabushiki Kaisha Toshiba, Kawasaki, Japan

[21] Appl. No.: 247,617

[22] Filed: Sep. 22, 1988

[30] Foreign Application Priority Data

Sep. 24, 1987 [JP] Japan .................. 62-237454

[51] Int. Cl.⁵ .................. G01R 11/32; G06G 7/16
[52] U.S. Cl. .................. 324/141; 324/142; 364/483; 364/841
[58] Field of Search .............. 324/141, 142; 364/483, 364/841, 842; 328/160

[56] References Cited

U.S. PATENT DOCUMENTS

| | | | |
|---|---|---|---|
| 3,953,795 | 4/1976 | Brunner et al. | 324/142 |
| 4,055,804 | 10/1977 | Mayfield | 324/142 |
| 4,079,313 | 3/1978 | Callan | 324/142 |
| 4,224,671 | 9/1980 | Sugiyama et al. | 324/142 |
| 4,498,138 | 2/1985 | Moore | 364/841 |

FOREIGN PATENT DOCUMENTS 2188170 1/1974 France .
1372978 11/1974 United Kingdom .
2094989 9/1982 United Kingdom .

Primary Examiner—Reinhard J. Eisenzopf
Assistant Examiner—Vinh P. Nguyen
Attorney, Agent, or Firm—Foley & Lardner, Schwartz, Jeffery, Schwaab, Mack, Blumenthal & Evans

[57] ABSTRACT

A multiplier having pulse width modulators for modulating input signals into pulse signals whose pulse widths are corresponding to the levels of the input signals and which are asynchronous to each other; an oscillator for outputting a pulse signal at a frequency higher than any one of those of the pulse signals from the pulse width modulators; a logical gate portion which receives the pulse signals from the pulse width modulators as well as the pulse signal from the oscillator to executes predetermined logical operation on the pulse signals; and a subtracter which calculates, according to the pulse widths of the pulse signals from the pulse width modulators, the number of pulses outputted within a predetermined interval from the oscillator to provide a signal proportional to the product of levels of the input signals.

5 Claims, 5 Drawing Sheets

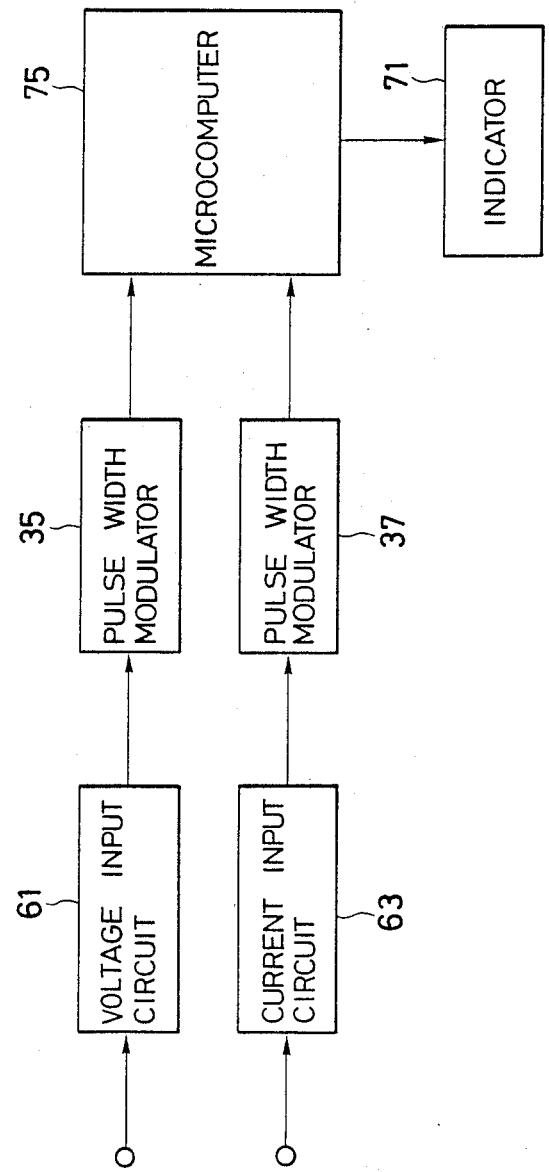

MULTIPLIER

BACKGROUND OF THE INVENTION

1. Field of the Invention

The present invention relates to a watt-hour meter for measuring electric power with the use of a multiplier which provides a digital output signal proportional to the product of input signal levels, and particularly to a multiplier which is suitable for integration.

2. Description of the Prior Art

FIG. 1 is a view showing a conventional multiplier which is applicable for a watt-hour meter for measuring electric power and provides a digital output signal proportional to the digital product of input signal levels. The multiplier shown in the figure is so constituted to provide a frequency proportional to the product of voltage values of two input signals.

In FIG. 1, an input signal is applied to an input terminal 1. A voltage of the input signal is modulated by a pulse width modulator 3 to provide a pulse signal. The pulse signal is applied to a switch 5 as well as being inverted in an inverter circuit 7 and applied to a switch 9. Namely, the switch 5 is opened and closed under the control of an output of the pulse width modulator 3, and the switch 9 is opened and closed under the control of an inverted output of the pulse width modulator 3.

An input signal to an input terminal 11 passes through the switch 5 and is smoothed in a smoothing circuit 16 which comprises a resistor 13 and a capacitor 15. The same input signal to the input terminal 11 is inverted and amplified in an inverter amplifier 23 which comprises an operational amplifier 17 and resistors 19 and 21. The inverted and amplified signal passes through the switch 9 and is smoothed in the smoothing circuit 16.

Namely, the input signal from the input terminal 11 and its inverted and amplified signal are selectively smoothed according to the pulse signal and its inverted signal which have been obtained by pulse-width-modulating and inverting the input signal to the input terminal 1. Thus, the input signals to the input terminals 1 and 11 are multiplied in time-sharing manner.

A multiplied and smoothed result from the smoothing circuit 16 is an analog signal which is converted in a voltage-to-frequency (V-F) converter circuit 25 into a frequency. Based on this frequency, a digital signal proportional to the product of voltage values of the input signals is obtainable.

In the application of this multiplier for a watt-hour meter, a digital signal proportional to the product of input voltage values is counted by a counter to display the counted result as electric energy.

Since the conventional multiplier applicable for a watt-hour meter analogously processes and multiplies input signals, it requires many parts such as capacitors and resistors to be assembled so that its size is unavoidably large to hinder its integration into an IC, particularly a custom IC.

To correctly measure electric energy, the capacitors of the multiplier must be accurate. The use of the switches 5 and 9 complicates the multiplier. If the switches 5 and 9 are semiconductor switches, their internal resistors may be affected by heat, to cause measurement errors.

Watt-hour meters presently marketed are well digitized by using microcomputers, etc. Therefore, it is desirable to digitize the multipliers.

SUMMARY OF THE INVENTION

An object of the present invention is to provide a multiplier which is compact and suitable for integration into an IC.

Another object of the present invention is to provide a multiplier applicable to a watt-hour meter and able to execute digital multiplication on pulse signals converted from input signals.

In order to accomplish the objects mentioned in the above, the present invention provides a multiplier which comprises converting means for converting input signals into pulse signals whose pulse widths are corresponding to the levels of the input signals and which are asynchronous to each other; an oscillating means for outputting a pulse signal at a frequency higher than any one of those of the pulse signals from the converting means; and a logic operation means which receives the pulse signals from the converting means as well as the pulse signal from the oscillating means, executes predetermined logical operation on the pulse signals and calculates, according to the pulse widths of the pulse signals outputted from the converting means, the number of pulses outputted within a predetermined interval from the oscillating means to provide a signal proportional to the product of levels of the input signals.

According to the multiplier with the above arrangement, input signals to be multiplied are converted into pulse signals whose pulse widths are corresponding to levels of the input signals. The logical operation is carried out on the pulse signals as well as on a predetermined pulse signal to digitally process the input signals and obtain a signal proportional to the product of levels of the input signals.

The multiplier of the present invention is the most suitable to apply for a digitized watt-hour meter.

These and other objects, features and advantages of the present invention will be more apparent from the following detailed description of preferred embodiments in conjunction with the accompanying drawings.

BRIEF DESCRIPTION OF THE DRAWINGS

FIG. 5 is a view showing the constitution of a watt-hour meter using a multiplier according to another embodiment of the present invention.

DETAILED DESCRIPTION OF THE PREFERRED EMBODIMENTS

Figure 1:
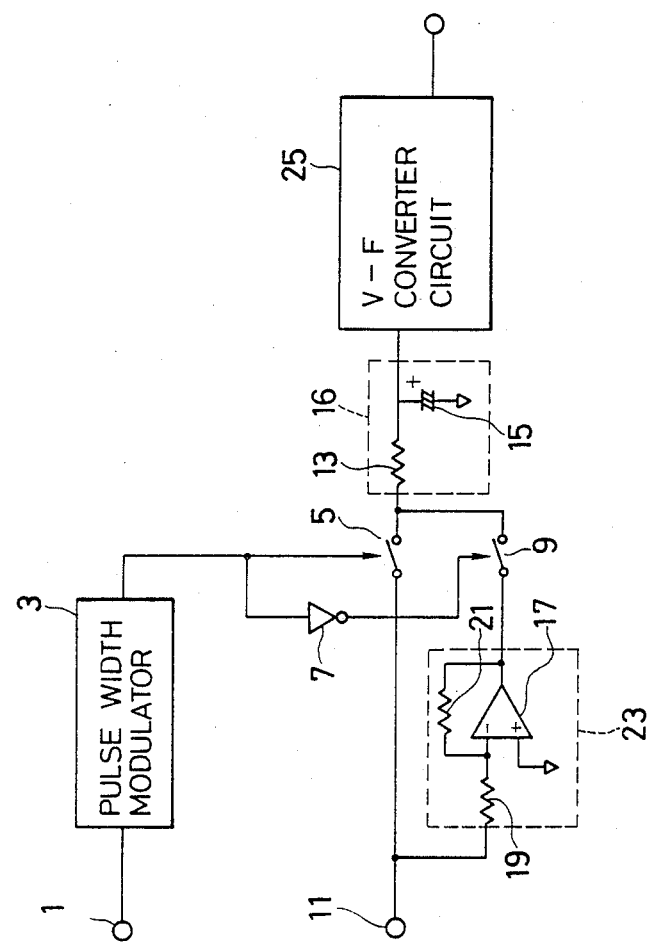
FIG. 1 is a block diagram showing the constitution of a multiplier applicable for a watt-hour meter, according to the prior art.
Figure 2:
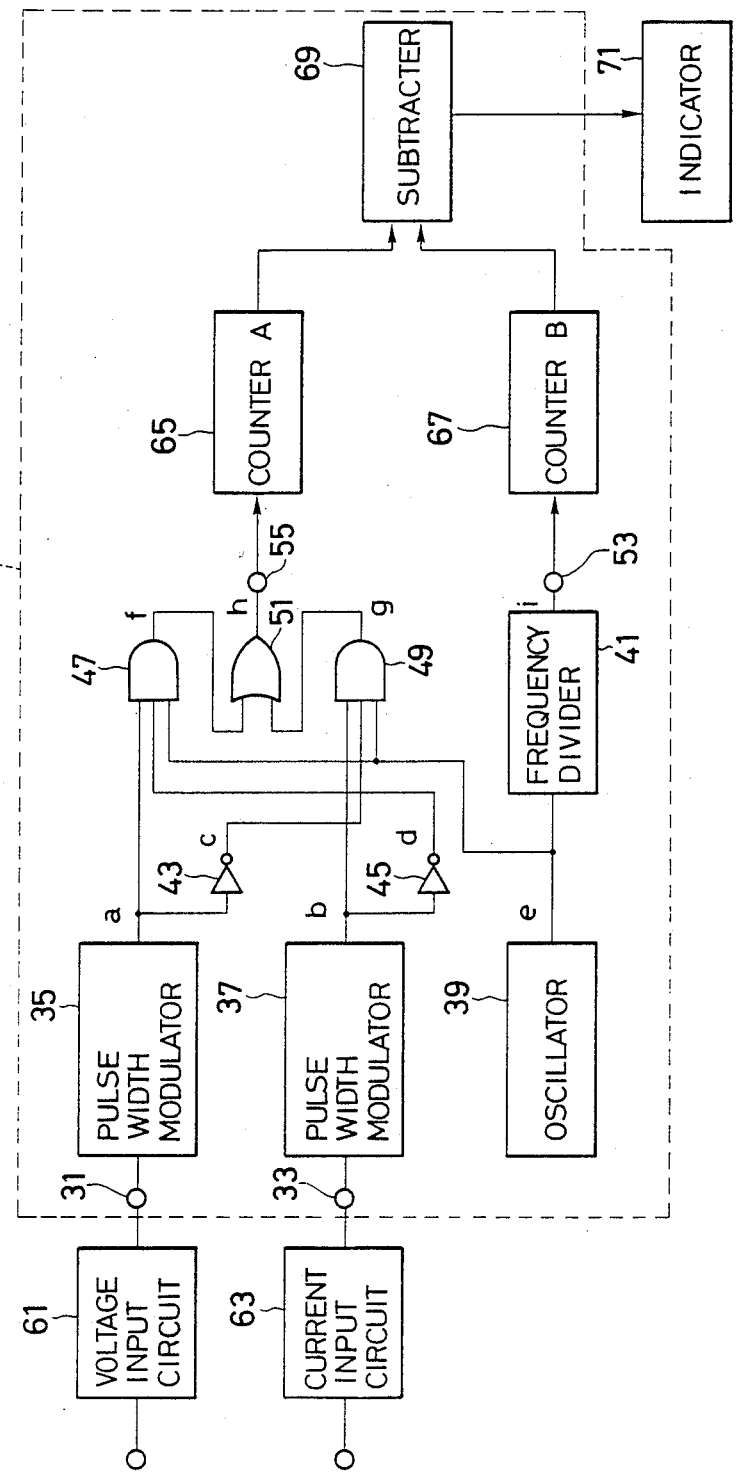
FIG. 2 is a view showing the constitution of a watt-hour meter using a multiplier according to the present invention.

FIG. 2 shows a multiplier 30 according to the present invention and a watt-hour meter 32 of a single phase two wire type using the multiplier 30.

The watt-hour meter 32 comprises: a voltage input circuit 61 for converting an external high voltage into a circuit low voltage and supplying it to the multiplier 30; a current input circuit 63 for converting an external high current into a circuit low voltage and supplying it to the multiplier 30; a multiplier 30 for pulse-widthmodulating the two input signals from the voltage input circuit 61 and current input circuit 63 and multiplying them to obtain a digital signal proportional to the product of the input signals; and an indicator 71 for indicating the digital signal from the multiplier 30.

The voltage and current inputted into the voltage input circuit 61 and current input circuit 63, respectively, are multiplied in the multiplier 30 and transferred as the digital signal representing electric energy to the indicator 71 on which the electric energy is indicated.

The details of the multiplier 30 of the present invention will be described.

As shown in FIG. 2, the multiplier 30 comprises pulse width modulators 35 and 37 which receive input signals from the voltage input circuit 61 and current input circuit 63 via input terminals 31 and 33, respectively; an oscillator 39; a frequency divider 41; inverter gates 43 and 45; AND gates 47 and 49; an OR gate 51; counters 65 and 67; and a subtracter 69.

The pulse width modulators 35 and 37 receive the input signals from the input terminals 31 and 33, respectively, to pulse-width-modulate the input signals. The pulse width modulator 35 gives an output pulse signal "a" to the inverter gate 43 and AND gate 47, while the pulse width modulator 37 gives an output pulse signal "b" to the inverter gate 45 and AND gate 49.

As shown in FIG. 3a, the pulse width modulator 35 modulates an input signal into a pulse signal whose one period is 2ta and those pulse width Ta changes according to an input voltage Va. The pulse width Ta is expressed as follows:

$$Ta = ta + \tau a$$

Here, the value $\tau a$ is proportional to the input voltage Va.

On the other hand, as shown in FIG. 3b, the pulse width modulator 37 modulates an input signal into a pulse signal whose one period is 2tb and whose pulse width Tb changes according to an input voltage Vb. The pulse width Tb is expressed as follows:

$$Tb = tb + \tau b$$

Here, the value $\tau b$ is proportional to the input voltage Vb.

The period 2ta of the output pulse signal "a" from the pulse width modulator 35 and the period 2tb of the output pulse signal "b" from the pulse width modulator 37 have random phases such that the phases do not synchronize with each other for a predetermined interval.

As shown in FIG. 3e, the oscillator 39 outputs a pulse train signal "e" with regular pulses at a frequency which is sufficiently higher than any one of the frequencies of the output pulse signals from the pulse width modulators 35 and 37. The pulse train signal "e" is given to the AND gates 47 and 49 and frequency divider 41.

The frequency divider 41 receives the pulse train signal "e" from the oscillator 39 and divides the frequency of the signal "e" by two to provide a pulse train signal "i" to an output terminal 53.

The inverter gate 43 receives the output pulse signal "a" from the pulse width modulator 35 and inverts the same to provide an inverted output signal "c" shown in FIG. 3c to the AND gate 49.

The inverter gate 45 receives the output pulse signal "b" from the pulse width modulator 37 and inverts the same to provide an inverted output signal "d" shown in FIG. 3d to the AND gate 47.

The AND gate 47 receives the output pulse signal "a" from the pulse width modulator 35, the inverted output signal "d" from the inverter gate 45 and the pulse train signal "e" from the oscillator 39, and finds a logical product of them to provide a logical product output "f" to the OR gate 51.

The AND gate 49 receives the output pulse signal "b" from the pulse width modulator 37, the inverted output signal "c" from the inverter gate 43 and the pulse train signal "e" from the oscillator 39, and finds a logical product of them to provide a logical product output "g" to the OR gate 51.

The OR gate 51 receives the logical product output "f" from the AND gate 47 and the logical product output "g" from the AND gate 49, and finds a logical sum of them to provide a logical sum output "h" to the output terminal 55.

The counters 65 and 67 count the number of pulses of the logical sum output "h" from the output terminal 55 and the number of pulses of the pulse train signal "i" from the output terminal 53, respectively.

The subtracter 69 subtracts a value of the counter 65 from a value of the counter 67 to provide a digital signal (electric energy) proportional to the product of the respective input signals.

Figure 3:
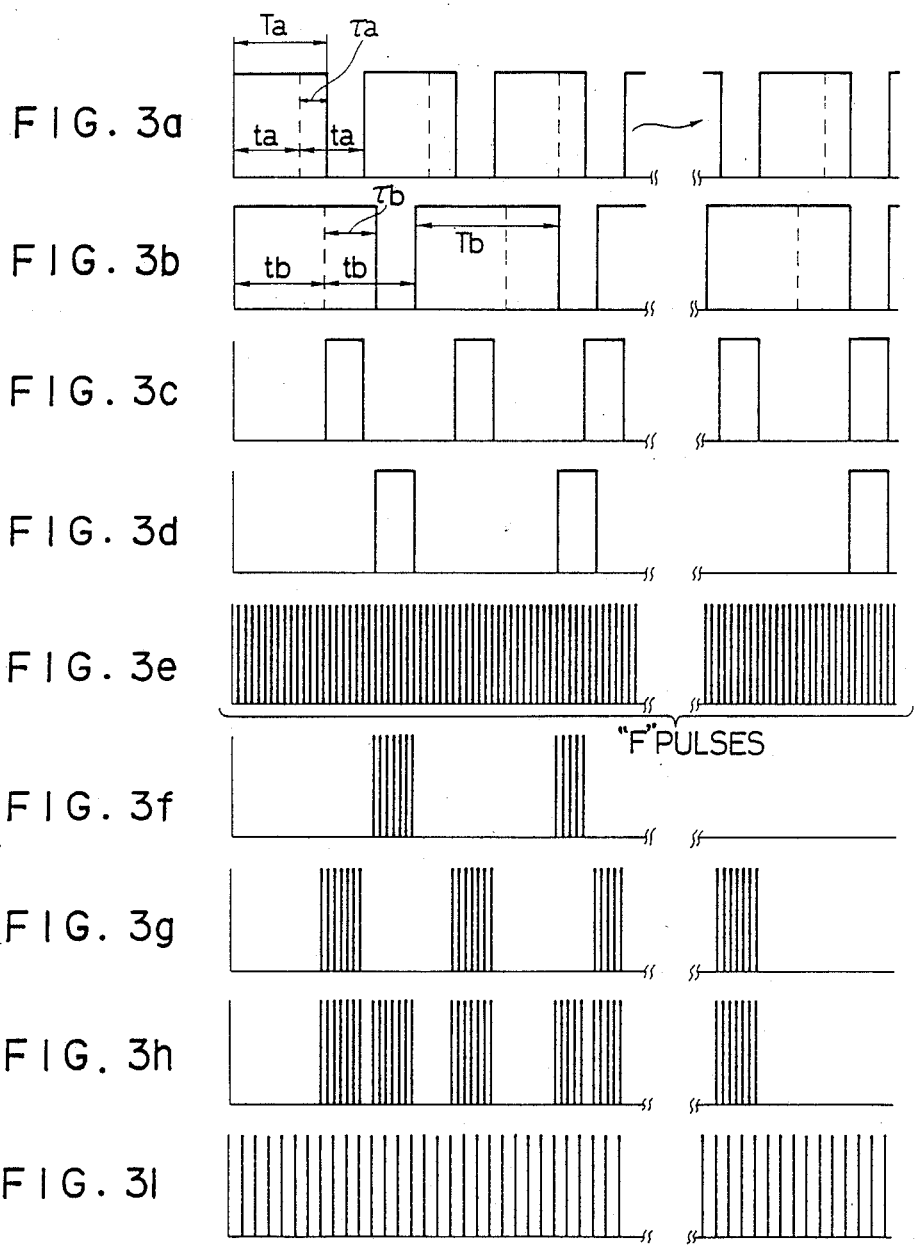
FIGS. 3a to 3i are waveform diagrams showing the operation of the multiplier of FIG. 2.

Operation of the multiplier 30 with the above-mentioned arrangement will be explained with reference to FIG. 3.

The input signals given to the input terminals 31 and 33 are modulated into the pulse signals "a" and "b" shown in FIGS. 3a and 3b according to their input voltages Va and Vb, respectively. As shown in FIG. 3e, the pulse train signal "e" has, for instance, "F" pulses within a predetermined time period which is sufficiently longer than one period of each of the output pulse signals "a" and "b". Then, the AND gate 47 provides the logical product output "f" shown in FIG. 3f. The number PA of output pulses of the logical product output "f" will be expressed as follows:

$$\begin{aligned} PA &= a \cdot d \cdot F \\ &= (ta + \tau a) / 2ta \times (tb - \tau b) / 2tb \times F \\ &= (ta \cdot tb - ta \cdot \tau b + tb \cdot \tau a - \tau a \cdot \tau b) \times F/4ta \cdot tb \end{aligned}$$

The AND gate 49 provides the logical product output "g" shown in FIG. 3g. The number PB of output pulses of the logical product output "g" will be expressed as follows:

$$\begin{aligned} PB &= b \cdot c \cdot F \\ &= (ta - \tau a) / 2ta \times (tb + \tau b) / 2tb \times F \\ &= (ta \cdot tb + ta \cdot \tau b - tb \cdot \tau a - \tau a \cdot \tau b) \times F/4ta \cdot tb \end{aligned}$$

The logical product outputs f and g are given to the OR gate 51 in which the logical sum of them is obtained. The logical product outputs f and g are not overlaying each other, and the logical sum output "h" of the OR gate 51 shown in FIG. 3h is given to the output terminal 55. The number PT of output pulses of the logical sum output is expressed as follows:

$$PT = PA + PB$$
$$= (ta \cdot tb - \tau a \cdot \tau b) \times F / 2ta \cdot tb$$
$$= (\tfrac{1}{2} - \tau a \cdot \tau b / 2ta \cdot tb) \times F$$

On the other hand, the number Pi of pulses of the pulse train signal "i" given from the frequency divider 41 to the output terminal 53 is F/2. The number of pulses of the pulse signals outputted to the output terminals 53 and 55 are counted by the counters 65 and 67, respectively. The substracter 69 subtracts the number of pulses of the logical sum output "h" from the number of pulses of the pulse train signal "i" to obtain the following number of pulses:

$$Pi - PT = F/2 - F/2 + F \times \tau a \cdot \tau b / 2ta \cdot tb$$
$$= F \times \tau a \cdot \tau b / 2ta \cdot tb$$

The values $\tau a$ and $\tau b$ are proportional to the input voltages Va and Vb so that, by subtracting the number of pulses of the pulse signal given to the output terminal 55 from the number of pulses of the pulse signal given to the output terminal 53, a digital signal proportional to the product (Va×Vb) of the input voltages, i.e., a digital signal proportional to electric energy can be obtained. The input voltages Va and Vb may be positive or negative so that quadrant multiplications (positive×positive, positive×negative, negative×positive, and negative×negative) may be possible.

Since analog input signals are pulse-modulated according to their levels and digitally processed and multiplied, the multiplier of the present invention can be integrated in an IC, particularly a custom IC. Even if the multiplier is not integrated in the IC, it can be easily assembled because only a small number of external parts such as capacitors and resistors are needed.

Figure 4:
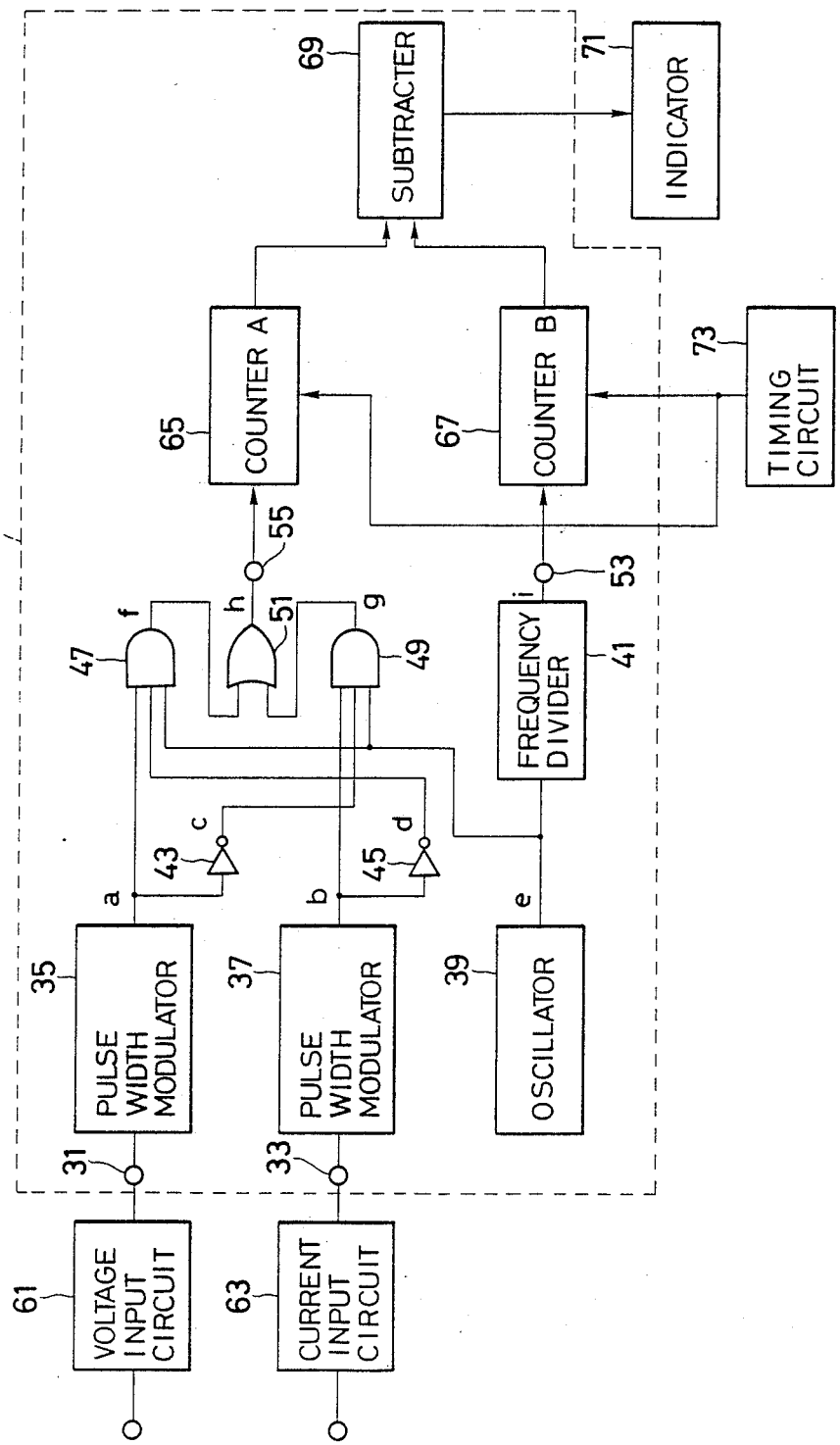
FIG. 4 is a view showing the constitution of a watt-meter using the multiplier of the present invention shown in FIG. 2.

As shown in FIG. 4, a timing circuit 73 may be connected to the counters 65 and 67 to form a wattmeter. The timing circuit 73 provides timing signals for latching and clearing, at regular intervals, values counted by the counters 65 and 67.

FIG. 5 shows another embodiment of the present invention. In the figure, outputs of pulse width modulators 35 and 37 are directly inputted into a microcomputer 75. The oscillator 39 of the first embodiment for outputting a pulse train signal is not used, but software of the microcomputer 75 realizes the functions of the gates 43, 45, 47, 49 and 51, oscillator 39, frequency divider 41, counters 65 and 67, and subtracter 69 of the first embodiment.

Although the multiplier 30 shown in FIG. 2 are using logical gates such as inverter gates, AND gates and OR gates, it is possible to use other kinds of gate circuits if they realize the similar logical operations. Further, it is possible to use three or more inputs instead of two which is the case used in the embodiments.

In summary, according to a multiplier of the present invention, input signals are converted into pulse signals having pulse widths corresponding to the levels of the input signals. Logical operation is carried out on the pulse signals as well as on a predetermined pulse signal to obtain a signal proportional to the product of levels of the input signals. Since the multiplier can digitally process the pulse signals converted from the input signals, the multiplier can suitably be integrated in an IC.

Various modifications will become possible for those skilled in the art after receiving the teachings of the present disclosure without departing from the scope thereof.

What is claimed is:

1. A multiplier for producing the product of a first input signal and a second input signal comprising:
    a first pulse modulator for forming a first modulated pulse train, wherein the difference between the pulse width and half the pulse repetition period is proportional to said first input;
    a second pulse modulator for forming a second modulated pulse train wherein the difference between the pulse width and half the pulse repetition period is proportional to said second input;
    an oscillator for forming a first reference pulse train;
    a coincidence circuit connected to said first and second modulators and said oscillator, for determining coincidences between the levels of said first and second modulated pulse trains and for outputting said first reference pulse train received from said oscillator only when the coincidence takes place;
    a first counter connected to said coincidence circuit in order to count said first reference pulse train outputted from said coincidence circuit;
    a frequency divider connected to said oscillator for outputting a second reference pulse train at half the frequency of said first reference pulse train;
    a second counter connected to said frequency divider for counting said second reference pulse train; and
    a subtractor connected to said first and second counters in order to subtract the output of said first counter from the output of said second counter.

2. The multiplier of claim 1 further comprising a timing circuit for repeatedly clearing said first and second counters at a certain interval or for latching the counted numbers of said first and second counters.

3. The multiplier of claim 1, wherein the pulse signals from said pulse modulators and oscillating means are processed to calculate, according to the pulse widths of the pulse signals from said pulse modulators, the number of pulses outputted within a predetermined interval from said oscillating means, thereby, to provide a signal proportional to the product of the levels of the input signals.

4. The multiplier of claim 1, wherein the output signals therefrom represent the multiplication of the input voltage by the input current, thereby providing an indication of electrical energy provided.

5. The multiplier of claim 4, further comprising a display means which displays, as electrical energy, a number of pulses outputted from said processor.

* * * * *